(12) United States Patent
Wang et al.

(10) Patent No.: US 8,120,955 B2
(45) Date of Patent: Feb. 21, 2012

(54) ARRAY AND CONTROL METHOD FOR FLASH BASED FPGA CELL

(75) Inventors: Zhigang Wang, Sunnyvale, CA (US); Fethi Dhaoui, Patterson, CA (US); John McCollum, Saratoga, CA (US); Vidyadhara Bellippady, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 266 days.

(21) Appl. No.: 12/371,483

(22) Filed: Feb. 13, 2009

(65) Prior Publication Data
US 2010/0208520 A1 Aug. 19, 2010

(51) Int. Cl.
*G11C 11/34* (2006.01)
(52) U.S. Cl. ......... 365/185.05; 365/185.01; 365/185.08; 365/185.18; 365/185.28
(58) Field of Classification Search ............. 365/185.18, 365/185.05, 185.25, 185.03, 185.13, 185.26, 365/189.11
See application file for complete search history.

(56) References Cited

U.S. PATENT DOCUMENTS

| | | |
|---|---|---|
| 4,758,745 A | 7/1988 | Elgamal et al. |
| 4,873,459 A | 10/1989 | El Gamal et al. |
| 4,904,338 A | 2/1990 | Kozicki |
| 5,314,772 A | 5/1994 | Kozicki et al. |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,729,162 A * | 3/1998 | Rouy .............................. 327/103 |
| 5,761,115 A | 6/1998 | Kozicki et al. |
| 5,812,452 A | 9/1998 | Hoang |
| 5,896,312 A | 4/1999 | Kozicki et al. |
| 5,914,893 A | 6/1999 | Kozicki et al. |
| 6,084,796 A | 7/2000 | Kozicki et al. |
| 6,100,560 A | 8/2000 | Lovett |
| 6,144,580 A | 11/2000 | Murray |
| 6,222,774 B1 | 4/2001 | Tanzawa et al. |
| 6,324,102 B1 | 11/2001 | McCollum |

(Continued)

OTHER PUBLICATIONS

Co-pending U.S. Appl. No. 11/851,324, filed Sep. 6, 2007 entitled Programmable Memory Cell and Array for Programmable Logic Including Trench Isolation.

(Continued)

*Primary Examiner* — Pho M Luu
*Assistant Examiner* — Thao Bui
(74) *Attorney, Agent, or Firm* — Lewis and Roca LLP

(57) ABSTRACT

A push-pull non-volatile memory array includes memory cells with an n-channel non-volatile pull-down transistor in series with a p-channel volatile pull-up transistor. A non-volatile transistor row line is associated with each row of the array and is coupled to the control gates of each n-channel non-volatile pull-down transistor in the row. A volatile transistor row line is associated with each row of the array and is coupled to the control gates of each p-channel volatile pull-up transistor in the row with which it is associated. A column line is associated with each column in the array and is coupled to the source of each p-channel volatile pull-up transistor in the column with which it is associated.

12 Claims, 3 Drawing Sheets

| Node Voltages (V) | Row 1 | | Row 2 | | Col 1 | Col 2 | NVM Source Nodes (All) | Bulk Nodes | |
|---|---|---|---|---|---|---|---|---|---|
| Ref #: | 32 | 34 | 48 | 50 | 52 | 54 | | P-well | N-well |
| Erase (All) | -17.5 | 0 | -17.5 | 0 | 0 | 0 | 0 | 0 | 0 |
| Program Cell 12 | +9 | 0 | 0 | +5 | +5 | 0 | 0 | 0 | +5 |
| Read Cell 12 | Sweep -3.3 to +3.3 | 0 | 0 | +3.3 | +1 | 0 | 0 | 0 | +1 |
| FPGA Normal Operation (All) | +1 | Vbias | +1 | Vbias | Vcc + Vtn | Vcc + Vtn | 0 | 0 | Vcc + Vtn |

U.S. PATENT DOCUMENTS

| | | |
|---|---|---|
| 6,348,365 B1 | 2/2002 | Moore et al. |
| 6,356,478 B1 | 3/2002 | McCollum |
| 6,388,324 B2 | 5/2002 | Kozicki |
| 6,418,049 B1 | 7/2002 | Kozicki et al. |
| 6,437,365 B1 | 8/2002 | Hawley et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,709,887 B2 | 3/2004 | Moore et al. |
| 6,798,692 B2 | 9/2004 | Kozicki et al. |
| 6,825,489 B2 | 11/2004 | Kozicki |
| 6,864,500 B2 | 3/2005 | Gilton |
| 6,865,117 B2 | 3/2005 | Kozicki |
| 6,891,769 B2 | 5/2005 | McCollum et al. |
| 6,914,802 B2 | 7/2005 | Kozicki |
| 6,927,411 B2 | 8/2005 | Kozicki |
| 6,940,745 B2 | 9/2005 | Kozicki |
| 6,955,940 B2 | 10/2005 | Campbell et al. |
| 6,970,383 B1 | 11/2005 | Han et al. |
| 6,985,378 B2 | 1/2006 | Kozicki |
| 6,998,312 B2 | 2/2006 | Kozicki et al. |
| 7,006,376 B2 | 2/2006 | Kozicki |
| 7,101,728 B2 | 9/2006 | Kozicki et al. |
| 7,120,053 B2 | 10/2006 | Atsumi et al. |
| 7,120,079 B2 | 10/2006 | McCollum et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,180,104 B2 | 2/2007 | Kozicki |
| 7,187,610 B1 | 3/2007 | McCollum et al. |
| 7,227,169 B2 | 6/2007 | Kozicki |
| 7,245,535 B2 * | 7/2007 | McCollum et al. ...... 365/185.18 |
| 7,288,781 B2 | 10/2007 | Kozicki |
| 7,294,875 B2 | 11/2007 | Kozicki |
| 7,301,821 B1 * | 11/2007 | Greene et al. ............ 365/185.28 |
| 7,368,789 B1 * | 5/2008 | Dhaoui et al. ................. 257/369 |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,430,137 B2 | 9/2008 | Greene et al. |
| 7,499,360 B2 | 3/2009 | McCollum et al. |
| 7,511,532 B2 | 3/2009 | Derharcobian et al. |
| 7,560,722 B2 | 7/2009 | Kozicki |
| 7,675,766 B2 | 3/2010 | Kozicki |
| 7,692,972 B1 | 4/2010 | Sadd et al. |
| 7,728,322 B2 | 6/2010 | Kozicki |
| 7,763,158 B2 | 7/2010 | Kozicki |
| 7,839,681 B2 | 11/2010 | Wang et al. |
| 2003/0107105 A1 | 6/2003 | Kozicki |
| 2004/0124407 A1 | 7/2004 | Kozicki et al. |
| 2005/0225413 A1 | 10/2005 | Kozicki et al. |
| 2006/0086989 A1 | 4/2006 | Lee et al. |
| 2006/0238185 A1 | 10/2006 | Kozicki |
| 2006/0291364 A1 | 12/2006 | Kozicki |
| 2007/0165446 A1 | 7/2007 | Oliva et al. |
| 2007/0165532 A1 | 7/2007 | Retana et al. |
| 2008/0101117 A1 | 5/2008 | Ogura et al. |
| 2008/0211540 A1 | 9/2008 | Fujita |
| 2008/0279028 A1 | 11/2008 | McCollum et al. |
| 2009/0283740 A1 | 11/2009 | Kozicki et al. |
| 2010/0092656 A1 | 4/2010 | Kozicki |
| 2010/0135071 A1 | 6/2010 | Kozicki |
| 2010/0149873 A1 | 6/2010 | Wang |
| 2010/0157688 A1 | 6/2010 | Issaq |
| 2011/0001108 A1 | 1/2011 | Greene et al. |
| 2011/0001115 A1 | 1/2011 | Greene et al. |
| 2011/0001116 A1 | 1/2011 | Greene et al. |
| 2011/0002167 A1 | 1/2011 | Mccollum |
| 2011/0024821 A1 | 2/2011 | Wang et al. |

OTHER PUBLICATIONS

Co-pending U.S. Appl. No. 12/177,680, filed Jul. 22, 2008 entitled Split Gate Memory Cell for Programmable Circuit Device.

Co-pending U.S. Appl. No. 12/334,059, filed Dec. 12, 2008 entitled Push-Pull FPGA Cell.

Co-pending U.S. Appl. No. 12/343,308 filed Dec. 23, 2008 entitled Push-Pull Memory Cell Configured for Simultaneous Programming of N-Channel and P-Channel Non-Volatile Transistors.

U.S. Appl. No. 11/851,324, filed Sep. 6, 2007 entitled "Programmable Memory Cell and Array for Programmable Logic Including Trench Isolation," and abandoned Jun. 19, 2009.

Office Action mailed Jun. 9, 2010 in copending U.S. Appl. No. 12/343,308, filed Dec. 23, 2003 entitled "Push-Pull Memory Cell Configured for Simultaneous Programming on N-Channel and P-Channel Non-Volatile Transistors".

Notice of Allowance mailed Nov. 26, 2010 in copending U.S. Appl. No. 12/343,308, filed Dec. 23, 2003 entitled "Push-Pull Memory Cell Configured for Simultaneous Programming on N-Channel and P-Channel Non-Volatile Transistors.".

Aratani, K. "A Novel Resistance Memory with High Scalability and Nanosecond Switching," IEDM, 2007, pp. 783-786.

Baek, I. G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, G. W. et al., "Overview of Candidate Device Technologies for Storage-class Memory," IBM Journal of Research & Development, 2008, vol. 52, No. 4/5, pp. 449-464.

Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, T. N. et al, "Erase Mechanism for Copper Oxide Resistive Switching Memory Cells with Nickel Electrode," Int'l Electron Devices Meeting, 2006, pp. 1-4.

Greene, Jonathan et al., "Antifuse Field Programmable Gate Arrays," Proceedings of the IEEE, Jul. 1993, vol. 81, No. 7, pp. 1042-1056.

Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pages.

Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, Dimitri B. et al., "The Missing Memristor Found," Nature, May 1, 2008, vol. 453, pp. 80-85.

Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

Lemieux, G. et al., "Directional and Single-Driver Wires in FPGA Interconnect," International Conference on Field-Programmable Technology (ICFPT), Dec. 2004, pp. 41-48, Brisbane, Australia.

* cited by examiner

| Node Voltages (V) | Row 1 | | Row 2 | | Col 1 | Col 2 | NVM Source Nodes (All) | Bulk Nodes | |
|---|---|---|---|---|---|---|---|---|---|
| Ref #: | 32 | 34 | 48 | 50 | 52 | 54 | | P-well | N-well |
| Erase (All) | -17.5 | 0 | -17.5 | 0 | 0 | 0 | 0 | 0 | 0 |
| Program Cell 12 | +9 | 0 | 0 | +5 | +5 | 0 | 0 | 0 | +5 |
| Read Cell 12 | Sweep -3.3 to +3.3 | 0 | 0 | +3.3 | +1 | 0 | 0 | 0 | +1 |
| FPGA Normal Operation (All) | +1 | Vbias | +1 | Vbias | Vcc + Vtn | Vcc + Vtn | 0 | 0 | Vcc + Vtn |

FIGURE 3

| Node Voltages (V) | Row 1 | | Row 2 | | Col 1 | Col 2 | NVM Source Nodes (All) | Bulk Nodes | |
|---|---|---|---|---|---|---|---|---|---|
| Ref #: | 82 | 84 | 98 | 100 | 102 | 104 | | P-well | N-well |
| Erase (All) | -17.5 | 0 | -17.5 | 0 | 0 | 0 | 0 | 0 | 0 |
| Program Cell 12 | +9 | 0 | -3.3 | 0 | +5 | 0 | 0 | 0 | +5 |
| Read Cell 12 | Sweep -3.3 to +3.3 | 0 | -3.3 | 0 | +1 | 0 | 0 | 0 | +1 |
| FPGA Normal Operation (All) | +1 | Vbias | +1 | Vbias | Vcc + Vtn | Vcc + Vtn | 0 | 0 | Vcc + Vtn |

FIGURE 4

ARRAY AND CONTROL METHOD FOR FLASH BASED FPGA CELL

BACKGROUND

1. Field of the Invention

The present invention relates to non-volatile memory arrays. In particular it relates to push-pull non-volatile memory cells for use in flash based Field Programmable Gate Arrays.

2. The Prior Art

NOR flash memories are known in the art. Over-erase is an issue very commonly encountered in traditional NOR flash memory schemes. In a NOR flash memory array, each memory cell is a single n-channel non-volatile transistor with its control gate coupled to a row line that is also coupled to all of the other control gates in the same row, its drain coupled to a bit line which is coupled to the drain of every other non-volatile transistor in the same column, and a source line which can be either a second row line or a second column line as a matter of design choice.

Over-erase typically occurs during a bulk erase operation of a memory block. This is typically done by driving the control gates of all the non-volatile transistors in the array to a large negative voltage and all of the source and drain nodes as well as the background material (typically a high voltage P-well for n-channel non-volatile transistors) to a much higher voltage that is typically ground. Alternatively the large negative voltage is split between a lesser negative voltage and a positive voltage. This causes electrons to tunnel off of the floating gate reducing the threshold voltage of the transistors to a negative threshold voltage. A negative threshold voltage means that the transistor will conduct current (also known as being "on") with 0V of control gate node voltage bias relative to the source node.

There is a distribution of the negative threshold voltages of the memory cells due to random manufacturing variations. Subsequent to the erase operation, some of the cells must be programmed to place them in the off condition. Hot carrier injection (or HCI) is commonly used for programming in the industry. Typically the polysilicon control gate and the drain of the memory device must be taken to a high positive voltage and significant current is then passed through the transistor channel diffusion to generate hot (or high energy) electrons that have enough energy to pass through the gate oxide to the floating gate and therefore place a negative charge on the floating gate to raise the threshold voltage, typically to a positive value. A positive threshold voltage means that the transistor will not conduct current (also known as being "off") with 0V of gate node voltage bias relative to the source node. To do this, all other row lines on the column must turn their memory cells off or the other memory cells on the column will pass current as well and prevent the intended cell from programming by depriving it of available programming current. If the Erase $V_t$ on one memory cell is too negative due to over-erase, then the over-erased memory cell will source enough current to inhibit programming other cells on the column even if its row line is properly driven negative. The same is true for the read condition where an over-erased memory cell can supply enough current to the column sense amplifier so that a properly programmed memory cell (i.e., the transistor is off and should source no read current) will appear to be erased (i.e., producing read current) due to the current of the over-erased cell, resulting in a reading error. It is therefore important that the erase distribution be controlled to prevent erased cells from being having too negative a threshold voltage.

In order to overcome this issue, a complicated smart erase scheme is typically implemented for the NOR erase. This involves erasing the array and then measuring the $V_t$ of each cell (inferred by measuring the read current against a precisely known reference current) and then doing a "soft program" of the over-erased cells. This soft program is used to increase the $V_t$ just enough to alleviate the over-erased condition while still leaving the threshold voltage sufficiently negative that each memory cell is still in the erased state. This is undesirable because it requires a substantial amount of complicated analog and control circuitry to implement.

Alternatively, a discrete access transistor is used in some NOR flash memory arrays. The access transistor can be used to block current through the non-volatile n-channel transistor to eliminate unwanted currents during programming or reading due to an over-erase condition. This is highly undesirable because adding a second transistor typically doubles the size of the memory cell, effectively halving the attainable memory density at any given process node.

A technique known as split gate can be used to provide an access transistor in a fraction of the area. A first row line is run in polysilicon at the normal width to produce an access transistor of minimum channel length. Then a second row line of control gate polysilicon above (also at the width for minimum transistor channel length with non-volatile transistor charge storage material aligned to and underneath it) is overlaid somewhat offset relative to the first row line, creating a memory transistor immediately adjacent to the access transistor. This effectively creates two transistors at each memory cell location: an n-channel volatile transistor under the first row line and a n-channel non-volatile transistor in series with it under the part of the second row line that is not over the first row line. This is undesirable because it complicates the semiconductor processing to produce the special split gate devices and increases the area of the memory cell (though much less than adding a discrete access transistor without any special processing).

Field Programmable Gate Array (FPGA) integrated circuit devices are known in the art. An FPGA comprises any number of initially uncommitted logic modules arranged in an array along with an appropriate amount of initially uncommitted routing resources. Logic modules are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as wires, switches, multiplexers, and buffers. Logic modules, routing resources, and other features like, for example, I/O buffers and memory blocks, are the programmable elements of the FPGA.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the functional blocks and routing resources can vary greatly and is appropriate for the type of control element used.

Non-volatile push-pull FPGA control elements are known in the art. Typically these memory cells employ a series arrangement of a pull up transistor and a pull down transistor in a series arrangement where the common node produces either a logic-1 or logic-0 signal during normal operation of the FPGA (i.e., when the FPGA is implementing a user logic function instead of being in a control mode performing erase, program, or read operations on the contents of the FPGA control elements) and have fairly elaborate programming schemes.

Two prior art non-volatile push-pull FPGA cells are disclosed in U.S. Pat. No. 6,144,580 to Murray in FIG. 1 and FIG. 2. Each cell has a non-volatile p-channel pull-up transistor and a non-volatile n-channel pull-down transistor. The cell in FIG. 1 has a single row line while the cell in FIG. 2 has two row lines. One disadvantage to this approach is the complicated programming scheme needed to operate the cell in different modes as illustrated in FIG. 3 through FIG. 6 of Murray.

Another non-volatile push-pull FPGA cell is disclosed in U.S. Pat. No. 5,587,603 to Kowshik. FIG. 1 shows a cell with a non-volatile p-channel pull-up transistor and a non-volatile n-channel pull-down transistor with the charge storage gates of the non-volatile transistors being a single common floating gate shared by both transistors. A somewhat elaborate programming scheme involving an additional select transistor and an EEPROM style erase node is illustrated in Kowshik FIG. 5.

Some prior art non-volatile push-pull FPGA cells combine a mixture of volatile and non-volatile transistors. Several such cells using different non-volatile technologies are disclosed in U.S. Pat. No. 7,245,535 to McCollum, et al, ("McCollum") in FIG. 1B through FIG. 1D. These cells combine a p-channel volatile pull-up transistor in a series arrangement with an n-channel non-volatile pull-down transistor, each cell employing a different non-volatile technology. A complimentary version of the cells with a p-channel non-volatile pull-up transistor in a series arrangement with an n-channel volatile pull-down transistor is also disclosed in FIG. 2B through FIG. 2D of McCollum.

Although these cells are shown in the McCollum figures with the p-channel volatile pull-up transistor sources coupled to $V_{cc}$ and the n-channel non-volatile pull-down transistor sources coupled to ground, the discussion of the programming and erase operations indicates that the connections to $V_{CC}$ and ground are control lines driven to $V_{CC}$ and ground during FPGA normal operation and not hard connections to power supplies. While McCollum does not describe the programming and erase operations in detail, the tables in the middle of column 3 and at the top of column 5 hint at the degree of manipulation of the various device terminals required by the various cells in the first and second groups of cells respectively.

Control schemes for this style of memory cell are disclosed in U.S. Pat. No. 7,301,821 to Greene, et al, ("Greene"). The various schemes disclosed in Greene show that a great deal of manipulation of the gate, source and bulk (or P-well) terminals of the non-volatile transistor is done, requiring a significant amount of programming circuitry.

BRIEF DESCRIPTION OF THE DRAWING FIGURES

FIG. 3 is a table showing the voltages applied at circuit nodes for operations performed on the memory array of FIG. 1.

FIG. 4 is a table showing the voltages applied at circuit nodes for operations performed on the memory array of FIG. 2.

DETAILED DESCRIPTION

Persons of ordinary skill in the art will realize that the following description of the present invention is illustrative only and not in any way limiting. Other embodiments of the invention will readily suggest themselves to such skilled persons.

According to the present invention a simplified programming scheme for an array of non-volatile push-pull memory cells comprising a p-channel volatile pull-up transistor in a series arrangement with an n-channel non-volatile pull-down transistor is disclosed. The source and bulk nodes of the N-channel non-volatile transistors in the array are coupled to ground, avoiding a significant amount of analog programming and control circuitry relative to the prior art and greatly simplifying the various memory operations.

According to the present invention, a row decoder is used in a push-pull memory cell to decode the gates of the non-volatile n-channel pull-down transistors. The p-channel pull-up transistors may or may not be decoded and can serve as the read access transistor during the read operation for the flash cell.

According to one aspect of the present invention, a push-pull non-volatile memory array includes memory cells with an n-channel non-volatile pull-down transistor in series with a p-channel volatile pull-up transistor. A non-volatile transistor row line is associated with each row of the array and is coupled to the control gates of each n-channel non-volatile pull-down transistor in the row. A volatile transistor row line is associated with each row of the array and is coupled to the control gates of each p-channel volatile pull-up transistor in the row. A column line is associated with each column in the array and is coupled to the source of each p-channel volatile pull-up transistor in the column with which it is associated.

According to another aspect of the present invention, a push-pull non-volatile memory array includes memory cells with an n-channel non-volatile pull-down transistor in series with a p-channel volatile pull-up transistor. A volatile transistor control line is coupled to the control gates of each p-channel volatile pull-up transistor in the array. A non-volatile transistor row line is associated with each row of the array and is coupled to the control gates of each n-channel non-volatile pull-down transistor in the row with which it is associated. A column line is associated with each column in the array and is coupled to the source of each p-channel volatile pull-up transistor in the column with which it is associated.

The proposed control scheme can avoid the over-erase problem that occurs during conventional flash erase operations.

Figure 1:
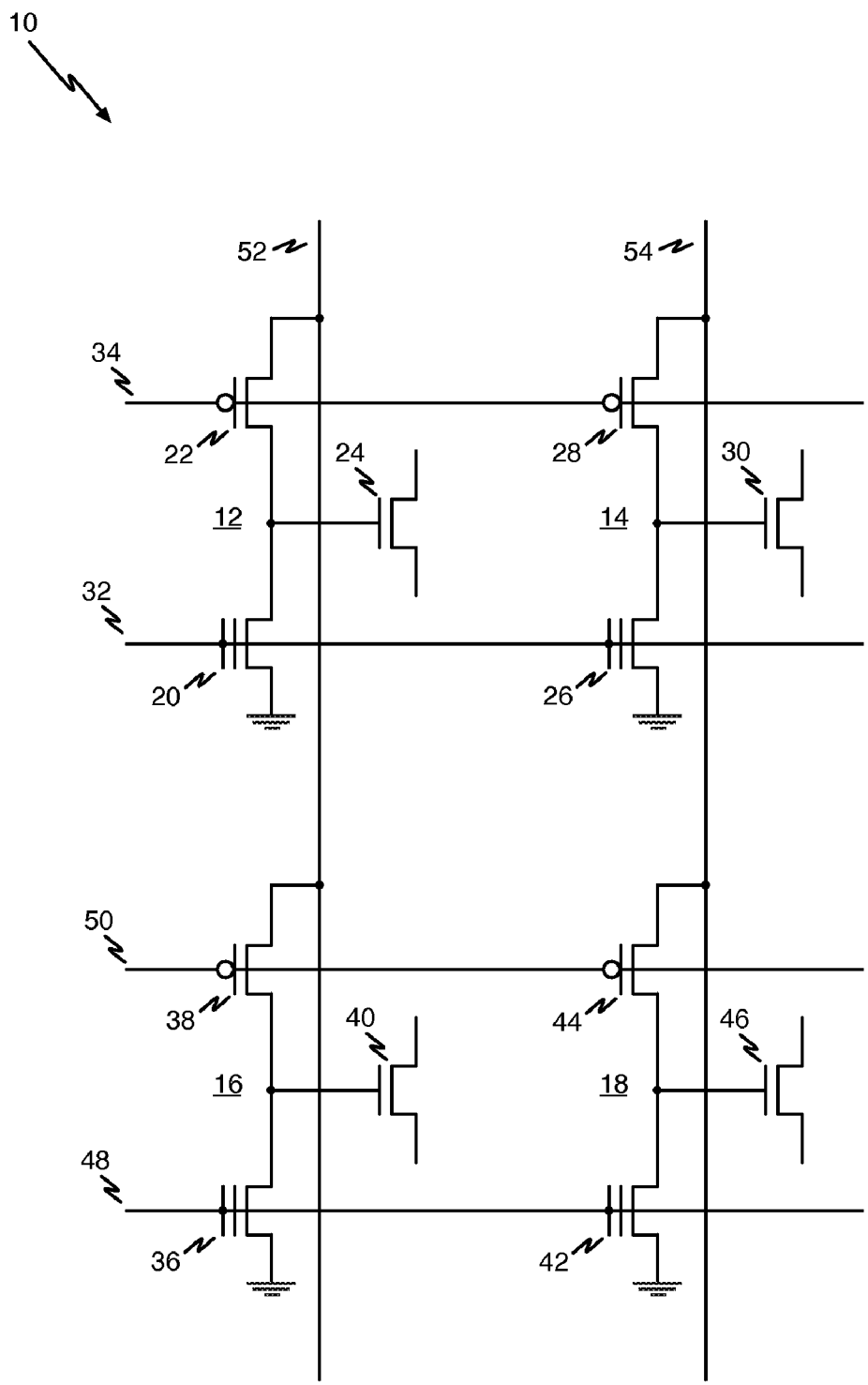
FIG. 1 is a schematic diagram of a portion of an illustrative flash memory array according to one aspect of the present invention.

Referring now to FIG. 1, a schematic diagram shows a portion 10 of an illustrative flash memory array according to one aspect of the present invention and illustrates the operations to be performed on the Flash memory array of push-pull flash based FPGA cells according to the present invention.

As may be seen from an examination of FIG. 1, memory array 10 includes flash memory cells 12 and 14 in a first row (Row 1) and flash memory cells 16 and 18 in a second row (Row 2). Flash memory cells 12 and 16 are in a first column (Col 1) of the array and flash memory cells 14 and 18 are in a second column (Col 2) of the array.

Memory cell 12 in the first row and first column of the array includes n-channel non-volatile transistor 20 having its source coupled to ground and its drain coupled to the drain of p-channel volatile pull-up transistor 22. The common drain connection of transistors 20 and 22 is connected to the gate of switch transistor 24. Memory cell 14 in the first row and second column of the array includes n-channel non-volatile transistor 26 having its source coupled to ground and its drain coupled to the drain of p-channel volatile pull-up transistor 28. The common drain connection of transistors 26 and 28 is connected to the gate of switch transistor 30.

The gates of n-channel non-volatile transistors 20 and 26 in memory cells 12 and 14 in the first row of the array are connected to a first row line 32 associated with the first row of the array. The gates of p-channel volatile pull-up transistors 22 and 28 in memory cells 12 and 14 in the first row of the array are connected to a second row line 34 associated with the first row of the array.

Memory cell 16 in the second row and first column of the array includes n-channel non-volatile transistor 36 having its source coupled to ground and its drain coupled to the drain of p-channel volatile pull-up transistor 38. The common drain connection of transistors 36 and 38 is connected to the gate of switch transistor 40. Memory cell 18 in the second row and second column of the array includes n-channel non-volatile transistor 42 having its source coupled to ground and its drain coupled to the drain of p-channel volatile pull-up transistor 44. The common drain connection of transistors 42 and 44 is connected to the gate of switch transistor 46.

The gates of n-channel non-volatile transistors 36 and 42 in memory cells 12 and 14 in the second row of the array are connected to a third row line 48 associated with the second row of the array. The gates of p-channel volatile pull-up transistors 38 and 44 in memory cells 16 and 18 in the second row of the array are connected to a fourth row line 50 associated with the second row of the array.

The sources of p-channel non-volatile pull-up transistors 22 and 38 in the first column of the array are connected to a first bit line 52 associated with the first column of the array. The sources of p-channel non-volatile pull-up transistors 28 and 44 in the second column of the array are connected to a second bit line 54 associated with the second column of the array. The bulk connections of the transistors are not shown in FIG. 1 to avoid cluttering the figure. The bulk nodes (or P-well) of the n-channel non-volatile transistors are all coupled to ground, and the bulk nodes (or N-well) of the p-channel volatile transistors are all coupled together. The N-well nodes can collectively be driven to a voltage level appropriate for the mode of operation.

As may be seen from FIG. 1, each row of the array utilizes two row lines, one to control the gates of the n-channel non-volatile transistors, and one to control the gates of the p-channel volatile pull-up transistors. The use of row lines 34 and 50 to control the gates of the p-channel volatile pull-up transistors in the first and second rows, respectively, separately allows for decoding the gates of the non-volatile p-channel pull-up transistors. Thus, the p-channel volatile pull-up transistors can serve as access transistors during the flash cell read operation. As will be appreciated by persons of ordinary skill in the art, separate row decoders are required, one to drive the row lines 32 and 48 to control the gates of the n-channel non-volatile pull-up transistors, and one to drive the row lines 34 and 50 to control the gates of the p-channel volatile pull-up transistors.

The erase operation for memory cells in the array 10 of FIG. 1 may be performed by placing a voltage such as −17.5V on all of the non-volatile pull-down row lines. A voltage such as 0V is placed on all of the volatile pull-up row lines, all of the bit lines, and the N-well. The source and bulk (P-well) nodes of the n-channel non-volatile transistors are already coupled to ground (and at a value of 0V by definition). This will cause all of the memory cells in the array to be erased simultaneously, since the high electric field generated by the large negative voltage on all of the non-volatile row lines removes electrons from the control gates through Fowler-Nordheim tunneling. This is when an over-erase condition can be created in some of the n-channel non-volatile transistors due to random variations in the manufacturing process.

As an example, if cells 12, 14, 16 and 18 are to be erased, a voltage such as −17.5V is applied to the non-volatile row lines 32 and 48. A voltage such as 0V is applied to the volatile row lines 34 and 50, the bit lines 52 and 54, and the N-well nodes (not shown in FIG. 1). The non-volatile pull-down transistor source and P-well nodes are already at 0V. These illustrative values are summarized in the line of the table of FIG. 3 labeled "Erase (All)." Persons skilled in the art will appreciate that the exact voltage values applied in any embodiment will be a function of the semiconductor process and the characteristics of the non-volatile transistors.

The program operation for memory cells in the array 10 of FIG. 1 may be performed by placing a voltage such as +9V on the non-volatile pull-down row line associated with a row including a cell to be programmed and placing a voltage such as 0V on the non-volatile row lines associated with cells where programming is to be inhibited. A voltage such as 0V is placed on the volatile pull-up row line associated with the row including a cell to be programmed and a voltage such as +5V is placed on the volatile pull-up row lines associated with cells where programming is to be inhibited. A voltage such as +5V is placed on the bit line associated with the column including a cell to be programmed and placing a voltage such as 0V on the bit lines associated with columns including cells where the program operation is to be inhibited. A voltage such as +5V is placed on the bulk node of the p-channel volatile transistors (the N-well—not shown in FIG. 1). The source and bulk (P-well) nodes of the n-channel non-volatile transistors are already coupled to ground. The large positive gate and drain voltages applied to the n-channel non-volatile transistor to be programmed will cause substantial current to flow and produce a sufficient number of hot carriers for HCI programming to occur.

As an example, if cell 12 is to be programmed, a voltage such as +9V is placed on the non-volatile pull-down row line 32 associated with the first row including memory cell 12 to be programmed. A voltage such as 0V is placed on the non-volatile row line 48 associated with the second row including cells where the programming operation is to be inhibited. A voltage such as 0V is placed on the volatile pull-up row line 34 associated with the row including memory cell 12 to be programmed and a voltage such as +5V is placed on the volatile pull-up row line 50 associated with the second row where programming is to be inhibited. A voltage such as +5V is placed on bit line 52 associated with the first column including memory cell 12 to be programmed and a voltage such as 0V is placed on bit line 54 associated with the second column including cells where the program operation is to be inhibited. A voltage such as +5V is placed on the N-well, while the source and P-well nodes of the n-channel non-volatile transistors are already coupled to ground. These illustrative values are summarized in the line of the table of FIG. 3 labeled "Program Cell 12." Persons skilled in the art will appreciate that the exact voltage values applied in any embodiment will be a function of the semiconductor process and the characteristics of the non-volatile transistors.

The read operation for memory cells in the array 10 of FIG. 1 may be performed by placing a voltage such as 0V on the volatile pull-up row line associated with the row including a cell to be read and placing a voltage such as +3.3V on the volatile pull-up row line associated with rows including cells where the read operation is to be inhibited. A voltage such as +1V is placed on the bit line associated with the column including a cell to be verified and placing a voltage such as 0V on the bit lines associated with columns including cells where the read operation is to be inhibited. A voltage such as 0V is placed on the non-volatile pull-down row line associated with rows including cells where the read operation is to be inhibited. The voltage on the non-volatile row line associated with the row including the cell on which the read operation is to be performed is swept, for example from about −3V to +3V. A voltage such as +1V is placed on the N-well node of the p-channel volatile transistors. The source and P-well nodes of the n-channel non-volatile transistors are already coupled to ground.

As an example, if cell 12 is to be verified, a voltage such as 0V is placed on volatile pull-up row line 34 associated with the first row including memory cell 12 to be verified. A voltage such as +3.3V is placed on volatile pull-up row line 50 associated with the second row including cells where the read operation is to be inhibited. A voltage such as +1V is placed on the first bit line 52 including memory cell 12 to be verified and a voltage such as such as 0V is placed on the other bit line 54 associated with the second column including cells where the read operation is to be inhibited. A voltage such as 0V is placed on non-volatile pull-down row line 48 associated with the second row including cells where the read operation is to be inhibited. The voltage on non-volatile pull-down row line 32 associated with the first row including cell 12 on which the read operation is to be performed is swept, for example, from about −3v to +3v. A voltage such as +1V is placed on the N-well node of the p-channel volatile transistors. The source and P-well nodes of the n-channel non-volatile transistors are already coupled to ground. These illustrative values are summarized in the line of the table of FIG. 3 labeled "Read Cell 12." Persons skilled in the art will appreciate that the exact voltage values applied in any embodiment will be a function of the semiconductor process and the characteristics of the non-volatile transistors.

To place the memory cells in the array 10 of FIG. 1 into FPGA Normal Operation mode, a voltage such as +1V is placed on all of the non-volatile pull-down row lines. This voltage on the control gates will cause n-channel non-volatile transistors that are erased to be turned on and n-channel non-volatile transistors that are programmed to be turned off. A voltage of at least $V_{CC}+V_{tn}$ is placed on all of the bit lines and the N-well. A voltage called $V_{bias}$ is placed on all of the volatile pull-up row lines. The source and bulk nodes of the n-channel non-volatile transistors are already coupled to ground.

$V_{CC}$ is the power supply voltage of the logic and routing programmable elements in the FPGA core such as logic modules, memory blocks, buffers and multiplexers. It will vary as a function of the voltage rating of the logic transistors and design choice. $V_{tn}$ is the threshold voltage of n-channel switch transistors such as transistors 24, 30, 40 and 46 in FIG. 1. When switch transistors are to be turned on due to the value programmed in their associated memory cell, the value $V_{CC}+V_{tn}$ is the minimum voltage required on the gate of the switch transistor to allow a $V_{CC}$ level logic signal to pass through the switch without signal degradation. In some embodiments, the FPGA may use circuit techniques such as level restoration after a signal passes through a switch or have the cell outputs couple to logic gates instead of pass transistors. In such cases, a different voltage such as $V_{CC}$ may be used instead.

$V_{bias}$ is a reference voltage generated to control the current through all of the p-channel volatile pull-up transistors in the array. Because there may be millions of FPGA control element memory cells in a large FPGA, this current must be very small, since it will flow to ground in every cell where the n-channel non-volatile pull-down transistor is on. Thus a small current such as one nanoampere (1 nA) may be desirable, though the value selected in any particular embodiment is a matter of design choice.

As an example, if cells 12, 14, 16 and 18 are to be placed into FPGA Normal Operation mode, a voltage such as +1V is applied to the non-volatile row lines 32 and 48. A reference voltage such as $V_{bias}$ is applied to the volatile row lines 34 and 50. A voltage such as $V_{CC}+V_{tn}$ is applied to the bit lines 52 and 54 and the N-well nodes (not shown in FIG. 1). The source and bulk nodes of the n-channel non-volatile transistors are already coupled to ground. These illustrative values are summarized in the line of the table of FIG. 3 labeled "FPGA Normal Operation (All)." Persons skilled in the art will appreciate that the exact voltage values applied in any embodiment will be a function of the semiconductor process and the characteristics of the non-volatile transistors.

As will be appreciated by persons of ordinary skill in the art, the use of a separate pull-up row line for the p-channel volatile pull-up transistors in memory cells in each row of the array allows turning off p-channel volatile pull-up transistors in unselected rows. This allows unselected memory cells to be disconnected from the column lines and thus prevents background column leakage from those unselected memory cells during program and read operations. The beginning-of-life (BOL) and end-of-life (EOL) $V_t$ window can advantageously be increased by over-erasing the flash cell. The programming current will be only the programming current needed for the cell being programmed. If the gates of the p-channel pull-up transistors 22 and 28 on the first row were not separately controlled from the gates of the p-channel pull-up transistors 38 and 44 on the second row, the programming current would be the cell current of the cell to be programmed plus the column leakage current through other memory cells. This is extremely unfavorable for program-current scaling.

Figure 2:
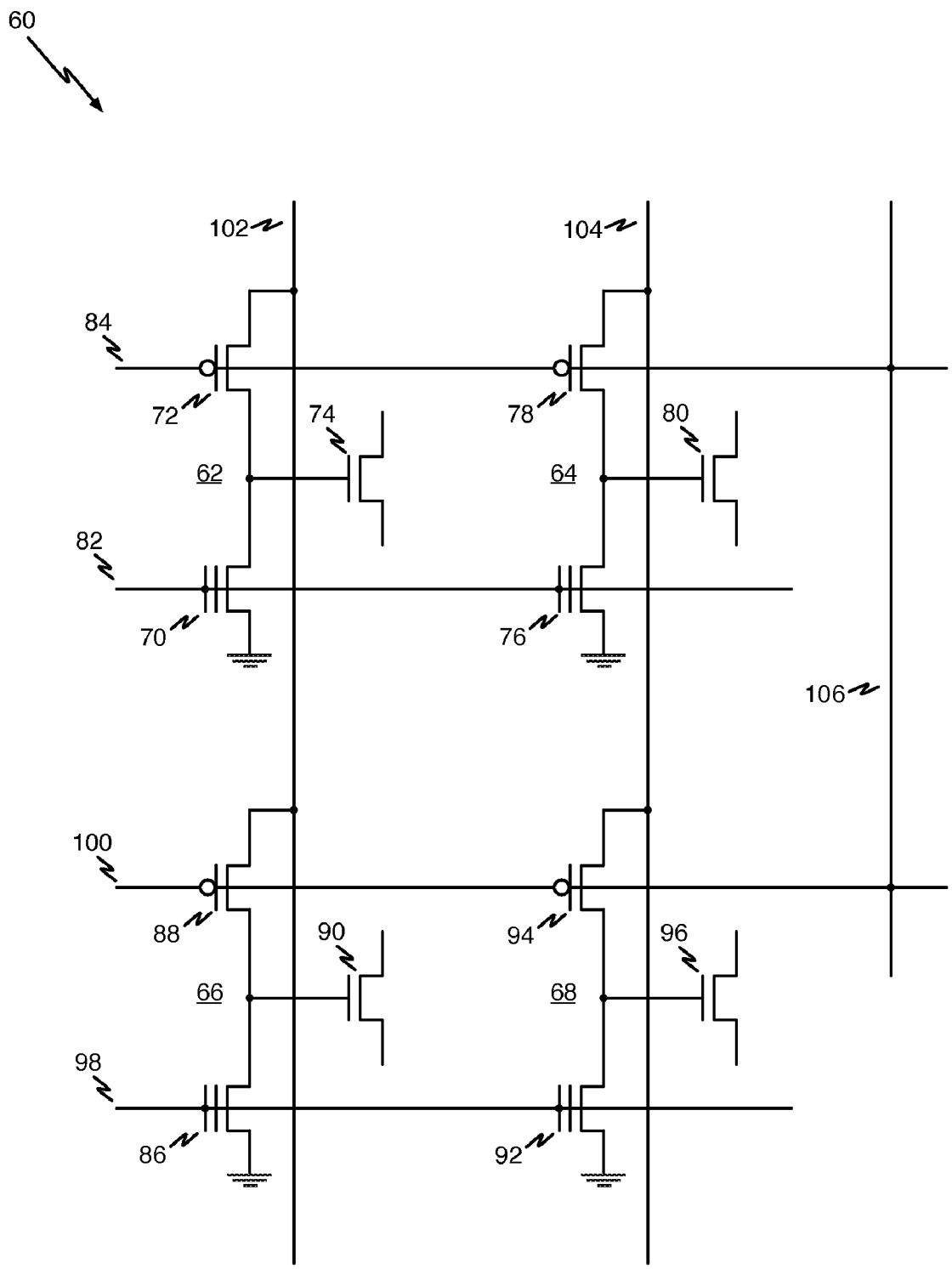
FIG. 2 is a schematic diagram of a portion of an illustrative flash memory array according to another aspect of the present invention.

Referring now to FIG. 2, a schematic diagram shows a portion 60 of an illustrative flash memory array according to another aspect of the present invention and illustrates the control scheme for sensing the Flash memory device in push-pull based flash FPGA cells according to the present invention.

As may be seen from an examination of FIG. 2, memory array 60 includes flash memory cells 62 and 64 in a first row (Row 1) and flash memory cells 66 and 66 in a second row (Row 2). Flash memory cells 62 and 66 are in a first column (Col 1) of the array and flash memory cells 64 and 68 are in a second column (Col 2) of the array.

Memory cell 62 in the first row and first column of the array includes n-channel non-volatile pull-down transistor 70 having its source coupled to ground and its drain coupled to the drain of p-channel volatile pull-up transistor 72. The common drain connection of transistors 70 and 72 is connected to the gate of switch transistor 74. Memory cell 64 in the first row and second column of the array includes n-channel non-volatile pull-down transistor 76 having its source coupled to ground and its drain coupled to the drain of p-channel volatile pull-up transistor 78. The common drain connection of transistors 76 and 78 is connected to the gate of switch transistor 80.

The gates of n-channel non-volatile pull-down transistors 70 and 76 in memory cells 62 and 64 in the first row of the array are connected to a first row line 82 associated with the first row of the array. The gates of p-channel volatile pull-up transistors 72 and 78 in memory cells 62 and 64 in the first row of the array are connected to a second row line 84 associated with the first row of the array.

Memory cell 66 in the second row and first column of the array includes n-channel non-volatile pull-down transistor 86 having its source coupled to ground and its drain coupled to the drain of p-channel volatile pull-up transistor 88. The common drain connection of transistors 86 and 88 is connected to the gate of switch transistor 90. Memory cell 68 in the second row and second column of the array includes n-channel non-volatile pull-down transistor 92 having its source coupled to ground and its drain coupled to the drain of p-channel volatile pull-up transistor 94. The common drain connection of transistors 92 and 94 is connected to the gate of switch transistor 96.

The gates of n-channel non-volatile pull-down transistors 86 and 92 in memory cells 62 and 64 in the second row of the array are connected to a third row line 98 associated with the second row of the array. The gates of p-channel volatile pull-up transistors 88 and 94 in memory cells 66 and 68 in the second row of the array are connected to a fourth row line 100 associated with the second row of the array.

The sources of p-channel non-volatile pull-up transistors 72 and 88 in the first column of the array are connected to a first bit line 102 associated with the first column of the array. The sources of p-channel non-volatile pull-up transistors 78 and 94 in the second column of the array are connected to a second bit line 104 associated with the second column of the array.

As may be seen from FIG. 2, each row of the array utilizes two row lines, one to control the gates of the n-channel non-volatile pull-down transistors and another to control the gates of the p-channel volatile pull-up transistors. The difference between the memory array 10 of FIG. 1 and memory array 60 of FIG. 2 is that row lines 84 and 100 used to control the gates of the p-channel volatile pull-up transistors in the first and second rows, respectively, are tied together by line 106 to simultaneously control the gates of the non-volatile p-channel pull-up transistors 72, 78, 88, and 94 in all rows of the array. The p-channel volatile pull-up transistors 72, 78, 88, and 94 also in FIG. 2 no longer serve as access transistors during the flash cell verify operation, but unlike the array 10 of FIG. 1, the array 60 of FIG. 2 does not require a separate row decoder for the p-channel pull-up transistors.

The erase operation for memory cells in the array 60 of FIG. 2 may be performed by placing a voltage such as −17.5V on all of the non-volatile pull-down row lines. A voltage such as 0V is placed on all of the volatile pull-up row lines, all of the bit lines, and the N-well. The source and bulk (P-well) nodes of the n-channel non-volatile transistors are already coupled to ground. This will cause all of the memory cells in the array to be erased simultaneously, since the high electric field generated by the large negative voltage on all of the non-volatile row lines removes electrons from the control gates through Fowler-Nordheim tunneling. This is when an over-erase condition may be created in some of the n-channel non-volatile transistors due to random variations in the manufacturing process.

As an example, if cells 62, 64, 66 and 68 in FIG. 2 are to be erased, a voltage such as −17.5V is applied to the non-volatile row lines 82 and 98. A voltage such as 0V is applied to the volatile row lines 84 and 90, the bit lines 102 and 104, and N-well nodes (not shown in FIG. 2). The source and bulk (P-well) nodes of the n-channel non-volatile transistors are already coupled to ground. These illustrative voltage values are summarized in the line of the table of FIG. 4 labeled "Erase (All)." Persons skilled in the art will appreciate that the exact voltage values applied in any embodiment will be a function of the semiconductor process and the characteristics of the non-volatile transistors.

The program operation for memory cells in the array 60 of FIG. 2 may be performed by placing a voltage such as +9V on the non-volatile pull-down row line associated with a row including a cell to be programmed and placing a voltage such as −3.3V on the non-volatile row lines associated with cells where programming is to be inhibited. A voltage such as 0V is placed on the volatile pull-up row lines. A voltage such as +5V is placed on the bit line associated with the column including a cell to be programmed and placing a voltage such as 0V on the bit lines associated with columns including cells where the program operation is to be inhibited. A voltage such as +5V is placed on the bulk nodes of the p-channel volatile transistors (the N-well—not shown in FIG. 2). The source and bulk (P-well) nodes of the n-channel non-volatile transistors are already coupled to ground. The large positive gate and drain voltages applied to the n-channel non-volatile transistor to be programmed will cause substantial current to flow and produce a sufficient number of hot carriers for HCI programming to occur. The major difference between this embodiment and that of FIG. 1 is the −3.3V needed on all non-volatile pull-down row lines (compared to 0V in FIG. 1). This is because the volatile pull-up transistors do not work effectively as access transistors in this embodiment and the n-channel non-volatile pull-down transistors must be forced completely off with a lower gate voltage.

As an example, if cell 62 is to be programmed, a voltage such as +9V is placed on the non-volatile pull-down row line 82 associated with the first row including memory cell 62 to be programmed. A voltage such as −3.3V is placed on the non-volatile row line 98 associated with the second row including cells where the programming operation is to be inhibited. A voltage such as 0V is placed on the volatile pull-up row lines 84 and 100. A voltage such as +5V is placed on bit line 102 associated with the first column including memory cell 62 to be programmed and a voltage such as 0V is placed on bit line 104 associated with the second column including cells where the program operation is to be inhibited. A voltage such as +5V is placed on the N-well, while the source and P-well nodes of the n-channel non-volatile transistors are already coupled to ground. Care must be taken in this embodiment when determining applied voltage values to avoid over-stressing the non-volatile pull-down transistor 86, which in some processes may be operating near its $BV_{ii}$ (or Breakdown Voltage due to Impact Ionization) voltage. These illustrative values are summarized in the line of the table of FIG. 4 labeled "Program Cell 12." Persons skilled in the art will appreciate that the exact voltage values applied in any embodiment will be a function of the semiconductor process and the characteristics of the non-volatile transistors.

The read operation for memory cells in the array 60 of FIG. 2 may be performed by placing a voltage such as 0V on the pull-up gate control lines. A voltage such as +1V is placed on the bit line associated with the column including a cell to be verified and placing a voltage such as 0V on the bit lines associated with columns including cells where the read operation is to be inhibited. A voltage such as −3.3V is placed on the non-volatile pull-down row lines associated with rows including cells where the read operation is to be inhibited. The voltage on the non-volatile row line associated with the row including the cell on which the read operation is to be performed is swept, for example, from about −3V to +3V.

As an example, if cell 62 is to be read, a voltage such 0V is placed on pull-up control lines 84 and 100. A voltage such as +1V is placed on the first column line 102 including memory cell 62 to be verified and a voltage such as such as 0V is placed on the other column line 104 associated with the second column including cells where the read operation is to be inhibited. A voltage such as −3.3V is placed on non-volatile row line 98 associated with the second row including cells where the read operation is to be inhibited. The voltage on non-volatile row line 82 associated with the first row including cell 62 on which the read operation is to be performed is swept, for example from about −3V to +3V.

To place the memory cells in the array 60 of FIG. 2 into FPGA Normal Operation mode, a voltage such as +1V is placed on all of the non-volatile pull-down row lines. This voltage on the control gates will cause n-channel non-volatile transistors that are erased to be turned on and n-channel non-volatile transistors that are programmed to be turned off. A voltage of at least $V_{CC}+V_{tn}$ is placed on all of the bit lines and the N-well. A voltage called $V_{bias}$ is placed on all of the volatile pull-up row lines. The source and bulk nodes of the n-channel non-volatile transistors are already coupled to ground.

$V_{CC}$ is the power supply voltage of the logic and routing programmable elements in the FPGA core such as logic modules, memory blocks, buffers and multiplexers. $V_{tn}$ is the threshold voltage of n-channel switch transistors such as transistors 74, 80, 90 and 96 in FIG. 2. When switch transistors are to be turned on due to the value programmed in their associated memory cell, the value $V_{CC}+V_{tn}$ is the minimum voltage required on the gate of the switch transistor to allow a $V_{CC}$ level logic signal to pass through the switch without signal degradation. In some embodiments, the FPGA may use circuit techniques such as level restoration after a signal passes through a switch or have the cell outputs couple to logic gates instead of pass transistors. In such cases, a different voltage such as $V_{CC}$ may be used instead.

$V_{bias}$ is a reference voltage generated to control the current through all of the p-channel volatile pull-up transistors in the array. Because there may be millions of FPGA control element memory cells in a large FPGA, this current must be very small, since it will flow to ground in every cell where the n-channel non-volatile pull-down transistor is on. Thus a small current such as one nanoampere (1 nA) may be desirable, though the value selected in any particular embodiment is a matter of design choice.

As an example, if cells 62, 64, 66 and 68 are to be placed into FPGA Normal Operation mode, a voltage such as +1V is applied to the non-volatile row lines 82 and 98. A reference voltage such as $V_{bias}$ is applied to the volatile row lines 84 and 90. A voltage such as $V_{CC}+V_{tn}$ is applied to the bit lines 102 and 104 and the N-well nodes (not shown in FIG. 2). The source and bulk nodes of the n-channel non-volatile transistors are already coupled to ground. These illustrative values are summarized in the line of the table of FIG. 4 labeled "FPGA Normal Operation (All)." Persons skilled in the art will appreciate that the exact voltage values applied in any embodiment will be a function of the semiconductor process and the characteristics of the non-volatile transistors.

The control scheme of the present has several advantages over the prior art. First, it provides a larger non-volatile transistor $V_t$ window because the flash devices can be over-erased without causing any column leakage. Since the embodiment of FIG. 1 uses the p-channel volatile pull-up transistors as access transistors, the n-channel non-volatile transistors can be deliberately over-erased to have lower negative threshold voltages on average without suffering the disadvantages.

Second, the proposed negative gate voltage control scheme of the embodiment of FIG. 2 can avoid the over-erase issue of the conventional flash erase operation during the reading and programming the push-pull flash cell in an FPGA.

Third, the conventional NOR erase scheme needs an embedded soft programming scheme because of the over-erase column leakage issue. The present invention eliminates the need for the analog and control circuitry and the additional soft programming time needed to use it, since the erase procedure is simplified to a simple erase operation followed by a simple verifying read operation for each cell in the array.

Fourth, the array 60 shown in FIG. 2 applies a negative gate voltage on the gates of the un-selected n-channel non-volatile pull-down transistors to shut off the background column leakage during the program and read. In addition to the advantages of the array 10 of FIG. 1, the array 60 of FIG. 2 has the further advantage that no additional pull-up row decoder is required, resulting in a smaller chip area.

Fifth, the overall programming scheme (including the erase, program, and read operations) is much simpler than in the prior art as illustrated in the tables in FIG. 3 and FIG. 4. Because the source nodes and P-well nodes of the n-channel non-volatile pull-down transistors are always coupled to ground, those columns ("NVM Source Nodes (All)" and "P-well") never change in the tables. The N-well column is always equal to the highest value that can be present on one of the bit lines. In many embodiments, a self-controlled analog switch can control the N-well voltage without the need for any active control. Thus addressing the cell or cells to be operated on by controlling the voltages on the row and column lines becomes largely a matter of providing voltages sources of the correct values and address inputs to the row line and bit line decoder circuits. This saves on chip area and programming time and is a highly desirable solution.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a non-volatile memory array including a plurality of push-pull memory cells, each memory cell having a unique pair of transistors including an n-channel non-volatile pull-down transistor having a source coupled to ground, a control gate and a drain, and a p-channel volatile pull-up transistor having a drain directly connected to the drain of the n-channel non-volatile pull-down transistor, a control gate and a source, the array arranged in rows and columns, the array including a non-volatile transistor row line associated with each row of the array, each non-volatile transistor row line coupled to the control gates of each n-channel non-volatile pull-down transistor in the row with which it is associated, a volatile transistor row line associated with each row of the array, each volatile transistor row line coupled to the control gates of each p-channel volatile pull-up transistor in the row with which it is associated, and a column line associated with each column in the array, each column line coupled to the source of each p-channel volatile pull-up transistor in the column with which it is associated, a method for programming and reading cells in the array, comprising:

controlling the voltages on the individual column lines;
controlling the voltage on the individual non-volatile transistor row lines; and controlling the voltages on the individual volatile transistor row lines.

2. The method of claim 1 wherein:
controlling the voltages on the individual column lines comprises placing a first voltage on each column line where action is to be inhibited and placing a second voltage on a column line where action is to be performed;
controlling the voltages on the individual non-volatile transistor row lines comprises placing a first voltage on each non-volatile transistor row line where action is to be inhibited and sweeping a second voltage on a non-volatile transistor row line where action is to be performed; and
controlling the voltages on the individual volatile transistor row lines comprises placing a first voltage on each volatile transistor row line where action is to be inhibited and placing a second voltage on a volatile transistor row line where action is to be performed.

3. The method of claim 2 wherein:
placing a first voltage on each column line where action is to be inhibited and placing a second voltage on a column line where action is to be performed comprises placing a first voltage on each column line where action is to be inhibited and placing a second voltage higher than the first voltage on a column line where action is to be performed;
placing a first voltage on each non-volatile transistor row line where action is to be inhibited and sweeping a second voltage on a non-volatile transistor row line where action is to be performed comprises placing a fixed voltage on each non-volatile transistor row line where action is to be inhibited and sweeping a second voltage higher than the fixed voltage on a non-volatile transistor row line where action is to be performed; and
placing a first voltage on each volatile transistor row line where action is to be inhibited and placing a second voltage on a volatile transistor row line where action is to be performed comprises placing a first voltage on each volatile transistor row line where action is to be inhibited and placing a second voltage lower than the first voltage on a volatile transistor row line where action is to be performed.

4. In a non-volatile memory array including a plurality of push-pull memory cells, each memory cell having a unique pair of transistors including an n-channel non-volatile pull-down transistor having a source coupled to ground, a control gate and a drain, and a p-channel volatile pull-up transistor having a drain directly connected to the drain of the n-channel non-volatile pull-down transistor, a control gate and a source, the array arranged in rows and columns, the array including a non-volatile transistor row line associated with each row of the array, each non-volatile transistor row line coupled to the control gates of each n-channel non-volatile pull-down transistor in the row with which it is associated, a volatile transistor control line coupled to the control gates of each p-channel volatile pull-up transistor in the array, and a column line associated with each column in the array, each column line coupled to the source of each p-channel volatile pull-up transistor in the column with which it is associated, a method for programming and reading cells in the array, comprising:
controlling the voltages on the individual column lines;
controlling the voltages on the individual non-volatile transistor row lines; and controlling the voltage on the volatile transistor control line.

5. The method of claim 4 wherein:
controlling the voltages on the individual column lines comprises placing a first voltage on each column line where action is to be inhibited and placing a second voltage on a column line where action is to be performed;
controlling the voltages on the individual non-volatile transistor row lines comprises placing a first voltage on each non-volatile transistor row line where action is to be inhibited and sweeping a second voltage on a non-volatile transistor row line where action is to be performed; and
controlling the voltage on the volatile transistor control line comprises placing a voltage on the volatile transistor control line.

6. The method of claim 5 wherein:
placing a first voltage on each column line where action is to be inhibited and placing a second voltage on a column line where action is to be performed comprises placing a first voltage on each column line where action is to be inhibited and placing a second voltage higher than the first voltage on a column line where action is to be performed;
placing a first voltage on each non-volatile transistor row line where action is to be inhibited and sweeping a second voltage on a non-volatile transistor row line where action is to be performed comprises placing a fixed negative voltage on each non-volatile transistor row line where action is to be inhibited and sweeping a second voltage higher than the fixed negative voltage on a non-volatile transistor row line where action is to be performed; and
placing a voltage on the volatile transistor control line comprises placing a voltage on the volatile transistor control line to turn on the p-channel volatile transistors in the array.

7. A non-volatile memory array including:
a plurality of push-pull memory cells, each memory cell having a unique pair of transistors including an n-channel non-volatile pull-down transistor having a source coupled to ground, a control gate and a drain, and a p-channel volatile pull-up transistor having a drain directly connected to the drain of the n-channel non-volatile pull-down transistor, a control gate and a source;
wherein the array is arranged in rows and columns, the array including:
a non-volatile transistor row line associated with each row of the array, each non-volatile transistor row line coupled to the control gates of each n-channel non-volatile pull-down transistor in the row with which it is associated;
a volatile transistor row line associated with each row of the array, each volatile transistor row line coupled to the control gates of each p-channel volatile pull-up transistor in the row with which it is associated; and
a column line associated with each column in the array, each column line coupled to the source of each p-channel volatile pull-up transistor in the column with which it is associated.

8. The push-pull non-volatile memory array of claim 7 wherein each memory cell further includes a switch transistor having a gate coupled to the drain of the p-channel volatile pull-up transistor and the drain of the n-channel non-volatile pull-down transistor.

9. The push-pull non-volatile memory array of claim 8 wherein each n-channel non-volatile pull-down transistor has a bulk node coupled to ground.

10. A non-volatile memory array including:

a plurality of push-pull memory cells, each memory cell having a unique pair of transistors including an n-channel non-volatile pull-down transistor having a source coupled to ground, a control gate and a drain, and a p-channel volatile pull-up transistor having a drain directly connected to the drain of the n-channel non-volatile pull-down transistor, a control gate and a source, the array arranged in rows and columns;

wherein the array includes:

a non-volatile transistor row line associated with each row of the array, each non-volatile transistor row line coupled to the control gates of each n-channel non-volatile pull-down transistor in the row with which it is associated;

a volatile transistor control line coupled to the control gates of each p-channel volatile pull-up transistor in the array; and a column line associated with each column in the array, each column line coupled to the source of each p-channel volatile pull-up transistor in the column with which it is associated.

11. The push-pull non-volatile memory array of claim 10 wherein each memory cell further includes a switch transistor having a gate coupled to the drain of the p-channel volatile pull-up transistor and the drain of the n-channel non-volatile pull-down transistor.

12. The push-pull non-volatile memory array of claim 11 wherein each n-channel non-volatile pull-down transistor has a bulk node coupled to ground.

* * * * *